(12) United States Patent  
Rueger

(10) Patent No.: US 7,189,287 B2
(45) Date of Patent: Mar. 13, 2007

(54) ATOMIC LAYER DEPOSITION USING ELECTRON BOMBARDMENT

(75) Inventor: Neal R. Rueger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 427 days.

(21) Appl. No.: 10/879,825

(22) Filed: Jun. 29, 2004

(65) Prior Publication Data
US 2005/0284360 A1 Dec. 29, 2005

(51) Int. Cl.
*C30B 25/14* (2006.01)
(52) U.S. Cl. .............................. 117/92; 117/89; 117/86; 117/94; 117/95; 117/108; 118/715; 118/718
(58) Field of Classification Search .................. 117/86, 117/89, 90, 94, 95, 105, 92, 108; 118/715, 118/718
See application file for complete search history.

(56) References Cited

U.S. PATENT DOCUMENTS

| 5,042,011 | A | 8/1991 | Casper et al. |
| 5,256,244 | A | 10/1993 | Ackerman |
| 5,280,205 | A | 1/1994 | Green et al. |
| 5,307,311 | A * | 4/1994 | Sliwa, Jr. ................. 365/174 |
| 5,627,785 | A | 5/1997 | Gilliam et al. |
| 5,903,098 | A * | 5/1999 | Jones ........................ 313/495 |
| 5,916,365 | A | 6/1999 | Sherman |
| 6,174,377 | B1 | 1/2001 | Doering et al. |
| 6,436,615 | B1 * | 8/2002 | Brandow et al. ........... 430/324 |
| 6,482,740 | B2 | 11/2002 | Soininen et al. |
| 6,630,201 | B2 | 10/2003 | Chiang et al. |
| 2003/0200917 | A1 | 10/2003 | Vaartstra |
| 2004/0036129 | A1 | 2/2004 | Forbes et al. |
| 2004/0124348 | A1 * | 7/2004 | Utz et al. ................... 250/251 |

FOREIGN PATENT DOCUMENTS

| WO | WO 00/79019 | 6/2000 |
| WO | WO 04/019394 | 3/2004 |

* cited by examiner

*Primary Examiner*—Robert Kunemund
(74) *Attorney, Agent, or Firm*—Mueting, Raasch & Gebhart, P.A.

(57) ABSTRACT

Formation of a layer of material on a surface by atomic layer deposition methods and systems includes using electron bombardment of the chemisorbed precursor.

69 Claims, 6 Drawing Sheets

ATOMIC LAYER DEPOSITION USING ELECTRON BOMBARDMENT

BACKGROUND OF THE INVENTION

The present invention pertains to deposition methods and systems. More particularly, the present invention relates to atomic layer deposition (ALD) methods and systems.

As integrated circuit (IC) dimensions shrink, the ability to deposit conformal thin films with excellent step coverage at low deposition temperatures is becoming increasingly important. Thin films are used, for example, in and/or for MOSFET gate dielectrics, DRAM capacitor dielectrics, adhesion promoting layers, diffusion barrier layers, electrode layers, seed layers, and/or for many other various functions. Low temperature processing is desired, for example, to better control certain reactions and to prevent degradation of previously deposited materials and their interfaces.

Conventional thin film deposition techniques, for example, such as physical vapor deposition (PVD) and chemical vapor deposition (CVD), are increasingly unable to meet the requirements of advanced thin films. PVD, such as sputtering, has been used for depositing conductive thin films at low cost and at relatively low substrate temperature. However, PVD is inherently a line-of-sight process, resulting in poor step coverage in high aspect ratio trenches and vias.

CVD processes can be tailored to provide conformal thin films with improved step coverage. Unfortunately, CVD processes often require high processing temperatures, resulting in incorporation of high impurity concentrations, and poor precursor utilization efficiency, leading to a high cost process.

Atomic layer deposition (ALD) has been used as an alternative to traditional CVD methods to deposit very thin films. ALD has several advantages over PVD and traditional CVD processes. For example, ALD can be performed at comparatively lower temperatures, has higher precursor utilization efficiency, and can provide conformal thin film layers, as well as provide control of film thickness on an atomic scale.

A typical ALD process differs significantly from traditional CVD processes. In a typical CVD process, for example, two or more reactant gases are mixed together in the deposition chamber, where either they react in the gas phase and deposit on the substrate surface, or they react on the substrate surface directly. Deposition by CVD occurs for a specified length of time, based on the desired thickness of the deposited film.

In an ALD process deposition cycle, for example, each reactant gas is introduced sequentially into a deposition chamber, so that no gas phase intermixing occurs. A monolayer of a first precursor is chemisorbed onto a surface on which material is to be deposited. Any excess of the first precursor is then pumped out, such as with the aid of an inert purging gas. Thereafter, a reactant is introduced to the deposition chamber to react with the chemisorbed species of the first precursor to form a monolayer or less of the desired material via a self-limiting surface reaction. The self-limiting surface reaction halts once the initially adsorbed precursor fully reacts with the reactant. Thereafter, excess reactant and any reaction by-products are pumped out, for example, with the aid of an inert purging gas. A desired film thickness is obtained by repeating the deposition cycle as necessary. The film thickness can be controlled on an atomic scale (e.g., angstrom scale) by controlling the number of deposition cycles.

Chemisorption occurs when adsorbed precursor molecules chemically react with active surface sites. Generally, chemisorption involves cleaving a weakly-bonded ligand (i.e., a portion of the precursor) from the precursor, leaving an unsatisfied bond available for reaction.

The ALD process temperature is carefully selected so that the precursor is sufficiently adsorbed (e.g., chemisorbed) on the surface on which the film is to be deposited. Further, the temperature must be such that the deposition reaction occurs with adequate growth rate and film purity. A temperature that is too high can result in desorption or decomposition, causing impurity incorporation. A temperature that is too low may result in incomplete chemisorption of the precursor, a slow or incomplete deposition reaction, no deposition reaction, or poor film quality (e.g., high resistivity, low density, poor adhesion, and/or high impurity content).

Such temperature selection is somewhat limiting on the ALD process. Plasma enhanced ALD, also referred to as radical enhanced atomic layer deposition (REALD), has been proposed to address temperature limitations of traditional thermal ALD. For example, in U.S. Pat. No. 5,916,365 to Sherman, entitled "Sequential chemical vapor deposition," issued 29 Jun. 1999, the reactant for converting the adsorbed precursor passes through a radiofrequency (RF) glow discharge, or plasma, to disassociate the reactant and to form reactive radical species to drive deposition reactions at lower process temperatures. However, plasma-enhanced ALD still has several disadvantages. For example, plasma-enhanced ALD remains a thermal process similar to traditional ALD, since the substrate temperature provides the required activation energy, and therefore, the primary control for deposition reaction.

Further, for example, in U.S. Pat. No. 6,630,201 B2 to Chiang et al., entitled "Adsorption process for atomic layer deposition," issued 7 Oct. 2003, an ALD process has been described which uses a plasma that includes energetic ions (e.g., argon$^+$ ions) and a plurality of reactive atoms to improve the plasma-enhanced ALD process. For example, as described therein, ions and atoms impinge on the surface of the substrate. Energetic ions transfer energy to the substrate, allowing reactive atoms to react with the chemisorbed precursor and to strip away unwanted ligands. The reactive atoms, in conjunction with energetic ions, act as the reactant to convert the adsorbed precursor on the surface to a monolayer or less of material resulting from the ALD cycle.

However, such low temperature ALD processing that uses plasma surface exposure and/or ion bombardment (e.g., ion bombardment using an ion source or ion gun) often results in at least some surface sputtering. For example, in one exemplary illustration, a capacitively coupled plasma may be generated above a wafer surface and provide ion bombardment with a mean ion energy of approximately 50 eV. For many materials, 35 eV is generally high enough to promote undesirable sputtering. Such sputtering is due to naturally-existing ion energy distributions that have a statistical fraction of ionic species with energies above the sputtering threshold. Such sputtering can result in low ALD film deposition rates in terms of fractions of angstroms per ALD cycle.

SUMMARY OF THE INVENTION

The present invention provides for energy transfer in an ALD process with little or no sputtering (e.g., sputtering events being a direct consequence of momentum transfer). The present invention, as described herein, uses electron exposure (e.g., electron bombardment) to provide such energy transfer in an ALD cycle. By using electrons as the carriers of energy to the chemisorbed precursor during an ALD cycle, collisions in which significant amounts of momentum transfer occur (e.g., in a plasma enhanced ALD process) are substantially reduced or non-existent. In other words, the energy transfer can be achieved with substantially reduced or without any sputtering.

A method for use in forming a layer according to the present invention includes providing a substrate assembly in a process chamber that includes a surface. The method further includes performing one or more deposition cycles to form a layer on the surface. Each deposition cycle includes providing a precursor (e.g., the precursor including a metal component) to the process chamber for chemisorption of the precursor on an underlying surface, removing any excess precursor from the process chamber, contacting the chemisorbed precursor with electrons, and providing a reactant in the process chamber for converting the chemisorbed precursor to a monolayer or less of material.

Another method for use in forming a layer by atomic layer deposition according to the present invention is described. The method includes providing a substrate assembly in a process chamber; the substrate assembly including a surface. The method further includes performing a plurality of atomic layer deposition cycles to form a layer on the surface. Each atomic layer deposition cycle includes at least exposing a chemisorbed precursor to electron bombardment.

In one embodiment of the method, at least one of the plurality of atomic layer deposition cycles may further include providing a precursor to the process chamber for chemisorption of the precursor on an underlying surface and providing a reactant in the process chamber for converting the chemisorbed precursor to material for forming the layer.

In another embodiment of the method, at least one of the plurality of atomic layer deposition cycles may further include providing a precursor to the process chamber for chemisorption of the precursor on an underlying surface. The precursor chemisorbed on the underlying surface includes a chemisorbed species associated with a plurality of ligands. The exposure of the chemisorbed precursor to electron bombardment results in conversion of the chemisorbed precursor to material for forming the layer and one or more of the plurality of ligands to volatile species.

Yet further, in one embodiment of the method, at least one of the atomic layer deposition cycles may further include purging the process chamber after chemisorption of the precursor and purging the process chamber after converting the chemisorbed precursor to the material for forming the layer.

Another method according to the present invention for use in forming a layer includes providing a substrate assembly in a process chamber; the substrate assembly includes a surface. The method further includes performing one or more deposition cycles to form a layer on the surface. Each deposition cycle includes providing a precursor to the process chamber for chemisorption of the precursor on an underlying surface, wherein the precursor chemisorbed on the underlying surface includes a chemisorbed species associated with a plurality of ligands. Each deposition cycle further includes removing any excess precursor from the process chamber, contacting the chemisorbed precursor with electrons to convert the chemisorbed precursor to material for forming the layer and to convert one or more of the plurality of ligands to volatile species, and purging the process chamber after completion of one deposition cycle prior to performing another deposition cycle.

Yet another method according to the present invention for use in forming a layer that includes at least one metal is described. The method includes providing a substrate assembly in a process chamber (e.g., the substrate assembly includes a surface) and performing one or more deposition cycles to form a layer on the surface. Each of the one or more deposition cycles includes providing a predetermined amount of at least one precursor in the process chamber for chemisorption on a deposition surface (e.g., the at least one precursor includes a metal component) and contacting the chemisorbed precursor with electrons for use in forming the layer on the surface of the substrate assembly.

Still another method for use in fabrication of an integrated circuit structure according to the present invention includes providing a substrate assembly in a process chamber (e.g., the substrate assembly includes a surface) and performing one or more deposition cycles to form a layer on the surface. Each of the one or more deposition cycles includes providing at least one precursor in the process chamber for chemisorption of the precursor on a deposition surface resulting in a chemisorbed species associated with a plurality of ligands and directing electrons toward the precursor chemisorbed on the deposition surface to modify the chemisorbed precursor.

A system for use in forming a layer is also described. The system includes a process chamber including a holder adapted to position a substrate assembly therein and at least one precursor source for providing a precursor to the process chamber during one or more atomic layer deposition cycles for chemisorption on a deposition surface. The system further includes an electron source operable to provide electrons for contact with a chemisorbed precursor on the substrate assembly when positioned by the holder.

Another system according to the present invention for use in forming a layer by atomic layer deposition includes a process chamber configured to perform atomic layer deposition and an electron source operable to provide electrons for contact with chemisorbed precursor on a substrate assembly when positioned within the process chamber.

In one or more embodiments of the system, the process chamber may be configured to receive one or more precursors therein, may be configured to be purged using at least one inert gas, may be adjustable to a pressure of at least 5 Torr for chemisorption of precursor, and further may be adjustable to a pressure of less than $10^{-4}$ Torr for generation of electrons to contact the chemisorbed precursor.

In one or more embodiments of the method or system according to the present invention, the method or system may include generation of an electron beam, generation of broad electron beam, scanning an electron beam across chemisorbed precursor, generation of electrons having an energy greater than about 30 eV and less than about 5 keV, and/or bombardment of chemisorbed precursor to remove one or more of a plurality of ligands associated therewith.

In yet another embodiment of the method or system, providing the precursor to the process chamber for chemisorption of the precursor includes providing the precursor to the process chamber at a pressure of at least 5 Torr, and further wherein contacting the chemisorbed precursor with electrons includes contacting the chemisorbed precursor with electrons in the process chamber at a pressure of less than $10^{-4}$ Torr.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

DETAILED DESCRIPTION OF THE EMBODIMENTS

The present invention shall be described generally with reference to FIGS. 1–3 and 7. Thereafter, the present invention and one or more applications for use thereof shall be described with reference to FIGS. 4–6.

The present invention provides for the use of energetic electron bombardment on surfaces which have chemisorbed species present as part of one or more ALD processes. The present invention contemplates the use of such energetic electrons in combination with any ALD process where suitable electron bombardment can be provided. The present invention is not limited to any particular ALD process. For example, electron bombardment according to the present invention may be used in ALD processes that include two-step ALD cycles, such as described with reference to U.S. Pat. No. 6,630,201, or other more conventional ALD processes that include four-step ALD cycles, also as described in U.S. Pat. No. 6,630,201. Further, the present invention is not limited in the number of ALD cycles performed to form a layer according to the present invention. In other words, any number of ALD cycles may be performed to form a layer according to the present invention.

As described with respect to at least one embodiment herein, the present invention provides for energy transfer in an ALD process with substantially reduced or without any sputtering (e.g., sputtering events being a direct consequence of momentum transfer). The process uses electron exposure (e.g., electron bombardment) to provide such energy transfer. By using electrons as the carriers of energy to the chemisorbed precursor during an ALD cycle, collisions in which significant amounts of momentum transfer occur (e.g., in a plasma enhanced ALD process) are substantially reduced or non-existent. For example, this reduced momentum is illustrated in the graph of FIG. 7.

Figure 7:
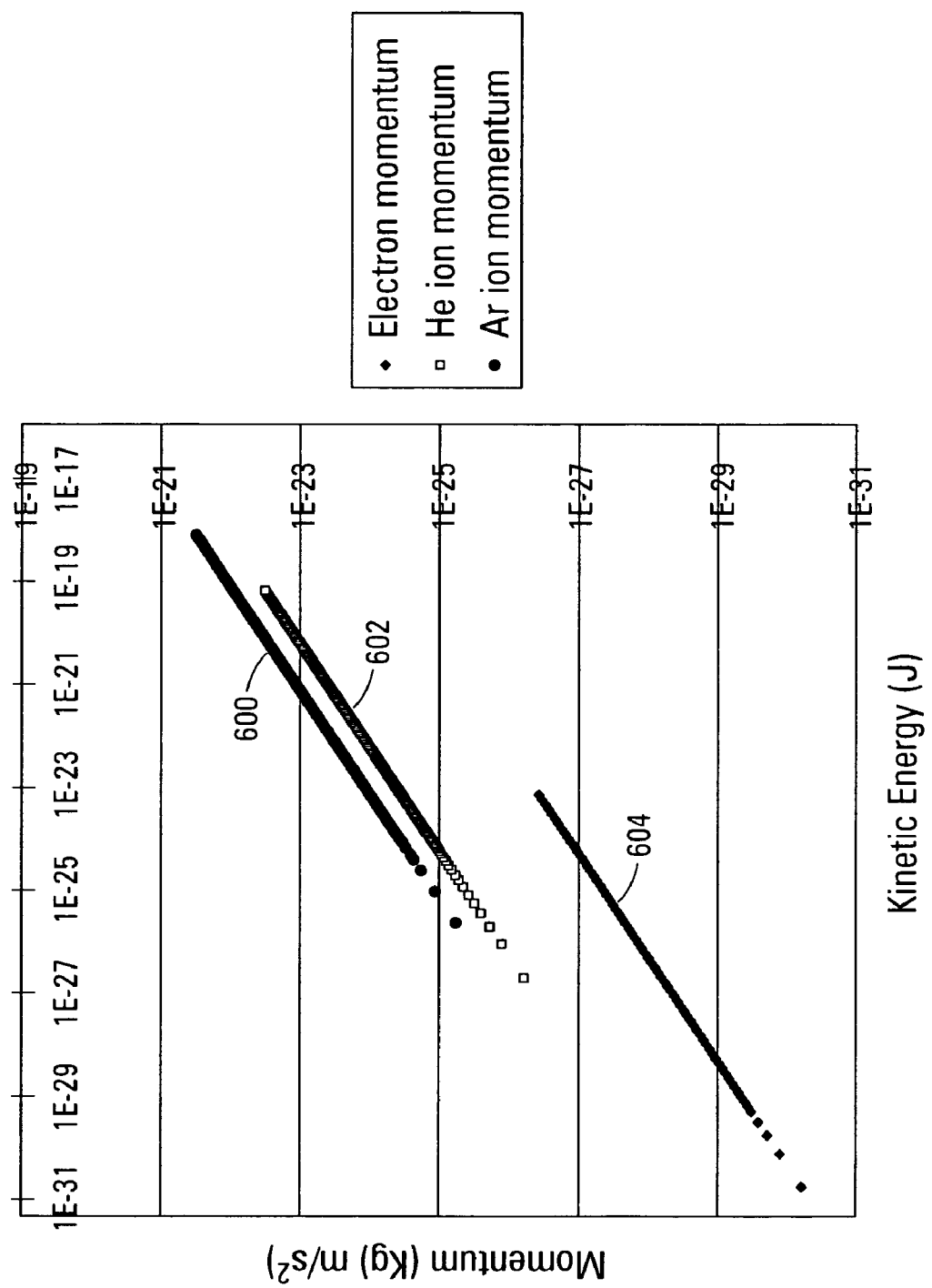
FIG. 7 is a graph showing momentum versus kinetic energy for an electron, a helium ion, and an argon ion.

FIG. 7 is a graph showing momentum versus kinetic energy for an electron 604, a helium ion 602, and an argon ion 600. As shown therein, there is a desirable benefit of momentum reduction in the case of an electron versus a helium or argon ion.

As used herein, "atomic layer deposition" (ALD) refers to a deposition process in which a plurality of consecutive deposition cycles are conducted in a process chamber (e.g., a deposition chamber). During each cycle, a precursor is chemisorbed to a deposition surface (e.g., a substrate assembly surface, or a previously deposited underlying surface such as material from a previous ALD cycle). Thereafter, if necessary, a reactant may subsequently be introduced into the process chamber for use in converting the chemisorbed precursor to the desired material on the deposition surface. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE) (see U.S. Pat. No. 5,256,244 to Ackerman), molecular beam epitaxy (MBE), gas source MBE, or organometallic MBE, and chemical beam epitaxy when performed with alternating pulses of precursor compound(s), reactive gas, and purge (e.g., inert carrier) gas.

"Precursor," as used herein, refers to a compound usable for forming, either alone or with other precursor compounds (or reactants), a layer on a substrate assembly in a deposition process. In one embodiment according to the present invention, the precursor includes a metal component such as, for example, a metal of Group VIIIB of the periodic table of elements (CAS version) (e.g., Ru, Pt, Ir, etc.), or, for example, a Group IIIA metal (e.g. Al, In, etc.). Further, one skilled in the art will recognize that the precursor will depend on the content of a layer 46 (see FIG. 3) which is ultimately to be formed using the ALD process. For instance, the precursor may include a metallic precursor such as $TiCl_4$. Further, for example, the precursor may be, but is clearly not limited to, an organometallic precursor. However, the present invention is not limited to use of precursors including metal components. Other layers may be formed with precursors that do not include metal components, such as oxide layers, gate oxides, etc. The present invention is not limited for use with any particular precursor.

"Chemisorption," as used herein, refers to the chemical adsorption of precursor (e.g., vaporized reactive precursor) on a deposition surface (e.g., a surface of a substrate assembly or a previously deposited ALD material). The chemisorbed species are generally irreversibly bound to the surface as a result of relatively strong binding forces characterized by high adsorption energies (greater than 30 kcal/mol) and comparable in strength to ordinary chemical bonds. Generally, the chemisorbed species are limited to the formation of a monolayer on the surface. Theoretically, chemisorption of precursor on the surface in an ALD cycle of the process forms a monolayer that is uniformly one atom or molecule thick on the entire exposed surface. In other words, a saturated monolayer is formed. ALD processes are based on the principle of a formation of a saturated monolayer of reactive precursor molecules by chemisorption.

Practically, chemisorption might not occur on all portions of the deposition surface (e.g., previously deposited ALD material). Nevertheless, such imperfect monolayer is still considered a monolayer in the context of the present invention. In many applications, merely a substantially saturated monolayer may be suitable. A substantially saturated monolayer is one that will still yield a deposited monolayer or less of material exhibiting the desired quality and/or properties.

As used in this application, "substrate assembly" refers to either a semiconductor substrate such as the base semiconductor layer, e.g., the lowest layer of silicon material in a wafer, or a silicon layer deposited on another material such as silicon on sapphire, or a semiconductor substrate having one or more layers or structures formed thereon or regions formed therein. When reference is made to a substrate assembly in the following description, various process steps may have been previously used to form or define regions, junctions, various structures, or features and openings such as transistors, active areas, diffusions, implanted regions, vias, contact openings, high aspect ratio openings, etc.

"Layer," as used herein, refers to any layer that can be formed from one or more precursors and/or reactants according to the deposition process described herein. The term "layer" is meant to include layers specific to the semiconductor industry, such as, but clearly not limited to, a barrier layer, dielectric layer, and conductive layer. The term "layer" is synonymous with the term "film" frequently used in the semiconductor industry. The term "layer" is also meant to include layers found in technology outside of semiconductor technology, such as coatings on glass. For example, such layers can be formed directly on fibers, wires, etc., which are substrates other than semiconductor substrates. Further, the layers can be formed directly on the lowest semiconductor surface of the substrate, or they can be formed on any of a variety of layers (e.g., surfaces) as in, for example, a patterned wafer.

The substrate assembly on which a layer is formed according to the present invention may include, for example, any suitable material such as, for example, silicon, polysilicon, platinum, iridium, rhodium, ruthenium, ruthenium oxide, titanium nitride, tantalum nitride, tantalum silicon nitride, silicon dioxide, aluminum, gallium arsenide, etc., as well as other existing or to be developed materials used in semiconductor fabrication, such as, for example, in the fabrication of dynamic random access memory (DRAM) devices, static random access memory (SRAM) devices, and ferroelectric memory (FERAM) devices.

"Reactant," as used herein, may include another precursor or reactant gas useable according to the present invention in an ALD cycle. For example, a reactant gas may include an oxidizing gas such as oxygen, water vapor, ozone, alcohol vapor, nitrogen oxide, sulfur oxide, hydrogen peroxide, and the like. However, such reactants may include any reactant(s) suitable for use in converting the chemisorbed species present on the deposition surface as part of an ALD cycle (e.g., provide a reducing atmosphere). As one skilled in the art will recognize, such reactants will depend upon the layer 46 ultimately formed from the ALD process, as shown generally in FIG. 3.

"Inert gas," as used herein, is any gas that is generally unreactive with the components it comes in contact with. For example, inert gases are typically selected from a group including nitrogen, argon, helium, neon, krypton, xenon, any other non-reactive gas, and mixtures thereof. Such inert gases are generally used in one or more purging processes described according to the present invention.

"Purging," according to the present invention, may involve a variety of techniques including, but not limited to, contacting the substrate and/or monolayer(s) formed according to the present invention with a carrier gas (e.g., an inert gas), and/or lowering pressure to below the deposition pressure to reduce the concentration of a species contacting the substrate assembly surface and/or chemisorbed species.

Purging may also include contacting the substrate assembly surface and/or monolayer(s) formed thereon with any substance that allows chemisorption byproducts to desorb and reduces the concentration of a species preparatory to introducing another species. A suitable amount of purging can be determined experimentally, as known to those skilled in the art. Purging time may successively be reduced to a purge time that yields desirable results, such as an increase in film growth rate.

Generally, the present invention uses energetic electron bombardment, as described herein, on surfaces which have chemisorbed species present as part of an ALD cycle of an ALD process. The electron bombardment can provide sufficient energy to promote ligand removal in an atmosphere including a reactant gas (e.g., in a reducing atmosphere) for converting the chemisorbed species to a material for forming the layer being deposited or otherwise modifying the chemisorbed species. Generally, at least in one or more embodiments of ALD processes, once chemisorption of the species is attained, ligand removal is required prior to the following cycle of an ALD process.

In other words, electron bombardment can promote ligand removal in an ALD cycle of an ALD process. Such promotion of ligand removal is supported by evidence that during most plasma processes, such processes are sustained through electron collisions with neutral species in the gas phase to result in electron impact ionization events. Further, surface modification as a result of electron bombardment has been shown by results of auger electron spectroscopy (AES) diagnostics. In such a type of surface analysis, energetic electron bombardment of surfaces used to create electron transitions within surface elements result in specific electron ejection mechanisms from the surface species. It has been shown that electron bombardment alters the surface bonding structures and stoichiometry. For example, bonds at the surface may be broke by electron bombardment.

Figure 1:
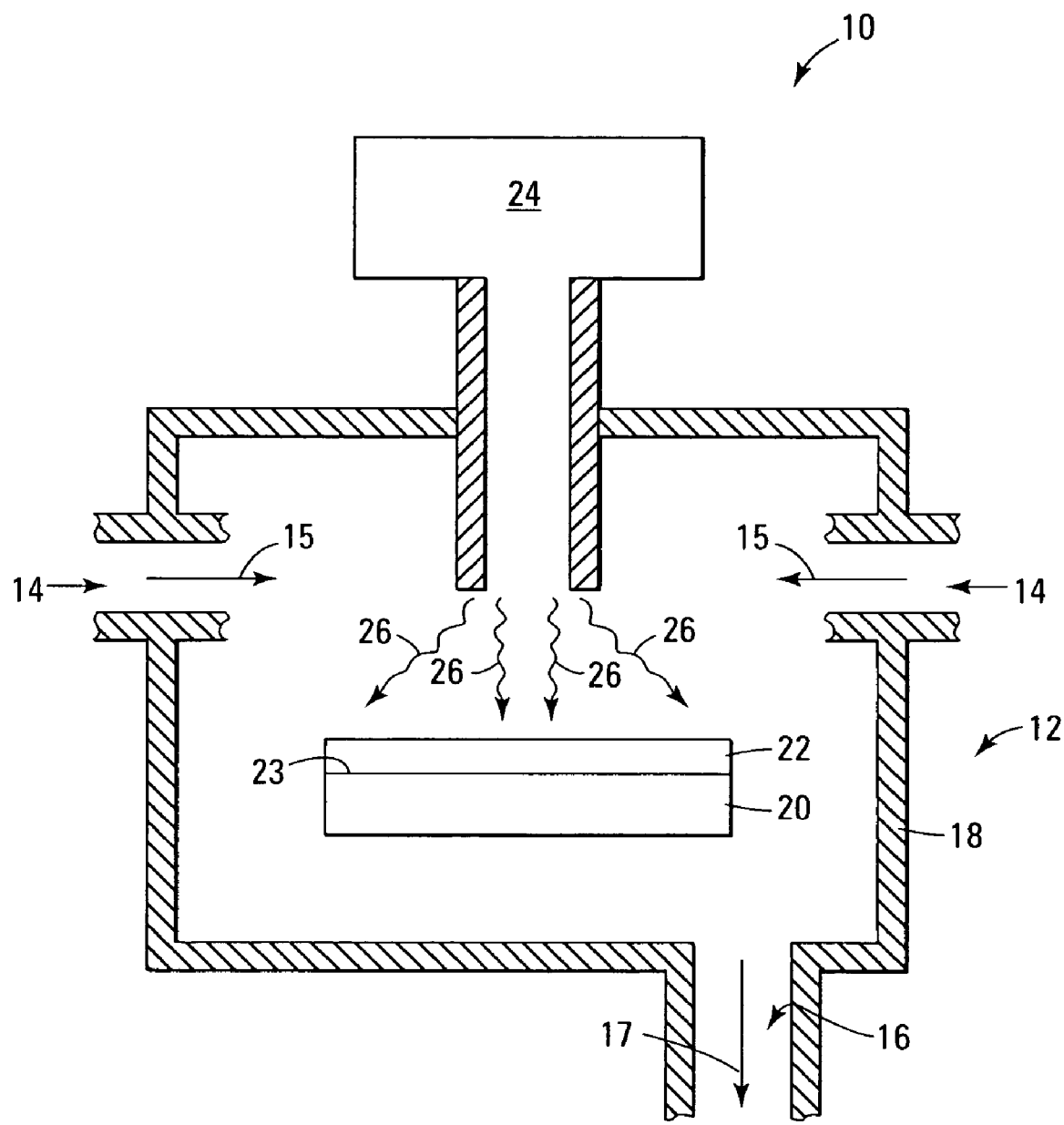
FIG. 1 is a schematic view of an exemplary apparatus which can be used in the implementation of one or more various aspects or methods according to the present invention.

FIG. 1 shows a general illustration of one exemplary embodiment of an ALD system 10 for implementing an ALD process according to the present invention. The ALD system 10 includes a process chamber 12 including inlet ports 14 and an exhaust port 16. In operation, one or more precursors and/or reactants can be provided (e.g., via a controlled flow) into the process chamber 12 through the inlet ports 14 from one or more precursor sources and/or reactant sources illustrated diagrammatically by arrows 15 in FIG. 1. Further, contents within process chamber 12 may be exhausted from the process chamber 12 through outlet port 16. The exhaust is illustrated generally by arrow 17 of FIG. 1. Although only two inlet ports and one outlet port 16 are illustrated, it is to be understood that varying numbers of inlet ports and outlet ports can be utilized.

Inlet ports 14 are in fluid communication with sources 15 of various precursors and/or reactants. Further, also various purge gases can be flowed through one or more of the inlet ports 14 during operation of the system 10, with such purge gases being inert relative to reaction with materials or precursors present within process chamber 12. The flow through inlet ports may be controlled using one or more different techniques (e.g., mass flow controllers, etc.).

Outlet port 16 may have a valve (not shown) associated therewith to allow the outlet to be opened or closed at various times during the operation of system 10. Further, a pump (not shown) may be provided to assist in withdrawing of contents from within chamber 12 during evacuation of process chamber 12.

Process chamber 12, as shown in FIG. 1, includes side walls 18 which surround the process chamber 12. Such side wall materials are generally constructed of inert materials relative to reaction with precursors and/or reactants ultimately to be flowed into process chamber 12.

A holder 20 is provided within process chamber 12. The holder 20 positions and supports a substrate assembly 22 therein. The holder 20 can be retained in a desired location within process chamber 12 utilizing various support structures (not shown). Further, holder 20 can be used to assist in maintaining a desired temperature of substrate assembly 22. Accordingly, holder 20 may be coupled with components (not shown) used for either heating or cooling of substrate assembly 22.

Further, according to the present invention, the ALD system 10 includes an electron source 24. The electron source 24 provides electrons 26 for contact with, for example, chemisorbed species on the substrate assembly 22.

The ALD system 10 shown in FIG. 1 is provided only generally as any suitable ALD reactor or other deposition system (e.g., a CVD system used to implement an ALD process) may be modified to include an electron source 24 for performing ALD according to the present invention. For example, various ALD systems are available from Angstron Systems, Inc., Santa Clara, Calif. Further, for example, various embodiments of illustrative ALD systems are described in U.S. Pat. No. 6,630,201, U.S. Pat. No. 6,174,377, and U.S. Pat. No. 5,916,365, or International Publication No. WO 00/79019 A1 corresponding to International Application No. PCT/US00/17202 filed 23 Jun. 2000 and entitled, "Apparatus for atomic layer chemical vapor deposition." Any one of such illustrative ALD system embodiments may be modified according to the present invention to provide for electron bombardment according to the present invention (e.g., exposure of a chemisorbed species to electron bombardment during a cycle of an ALD process).

As such, the ALD system 10 may include various control features, such as those required to control temperature within the process chamber 12 or of the substrate assembly 22, components necessary to control pressure within process chamber 12, components necessary to control input of precursor and/or reactant into process chamber 12, as well as any other control system components necessary for performing one or more ALD cycles of an ALD process. In other words, any suitable ALD system 10 modified to include apparatus for providing electron bombardment of a chemisorbed species on a surface within the process chamber 12 is contemplated within the present invention.

In other words, at least in one embodiment, the electron source 24 is operable to provide electrons for contact with the chemisorbed precursor within the process chamber 12. The electron source 24 which is operable for providing such electrons for contact with the chemisorbed species may include components located within process chamber 12 or remotely therefrom.

For example, in one embodiment, the electron source 24 may include an electron gun operable for generating an electron beam. In one embodiment, the electron beam may be a narrow beam that is scanned or rastered across the chemisorbed species within process chamber 12.

In an alternate embodiment, the electron generating apparatus may produce a broad beam of electrons for contact with the chemisorbed species. As used herein, broad beam refers to a beam of electrons suitable for contacting a desired region or the entire portion of chemisorbed species without scanning or rastering thereof.

Such electron beams may be generated using field emission devices, thermionic devices, or any suitable elements or apparatus operable for generating electron beams such as an electron gun or field emitter array.

Further, for example, such electrons may be provided using a plasma and a positively charged grid for accelerating electrons from the plasma (e.g., a positively charged fine mesh). In other words, the energetic electrons for use in bombarding the chemisorbed species may be provided using any number of devices, and the present invention is not limited to any particular electron gun or electron generating apparatus.

In one embodiment, the electron source 24 provides electrons having a mean energy that is greater than about 30 eV and/or less than about 100 KeV. In another embodiment, the electron source 24 provides electrons having a mean energy that is greater than about 100 eV and/or less than about 5 KeV. Further, yet in another embodiment according to the present invention, the electrons are provided with an energy sufficient for modifying the species chemisorbed on the deposition surface.

One will understand that the chemisorbed species on the surface will be associated with a plurality of ligands. Preferably, the electrons have sufficient energy for removing one or more of such ligands from the chemisorbed species (e.g., disassociating a plurality of ligands therefrom).

Figure 2A:
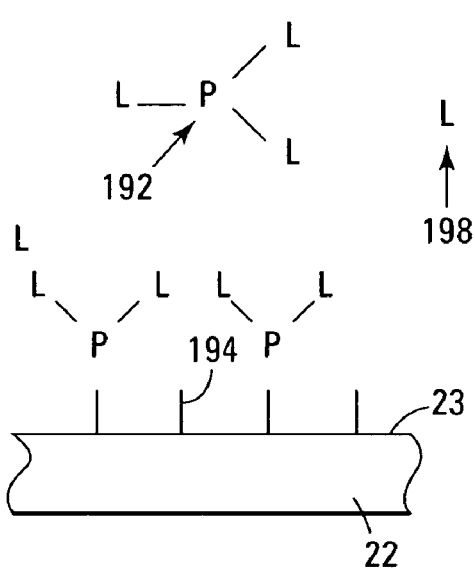
FIGS. 2A–2D show a diagrammatic view of a substrate assembly during an ALD cycle according to one exemplary embodiment of the present invention.
Figure 2B:
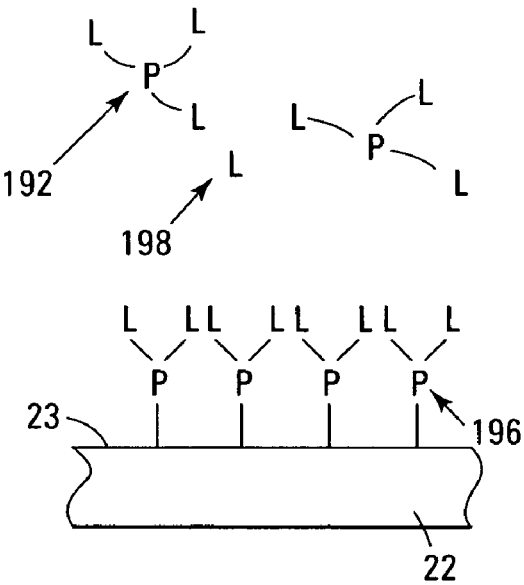
Figure 2C:
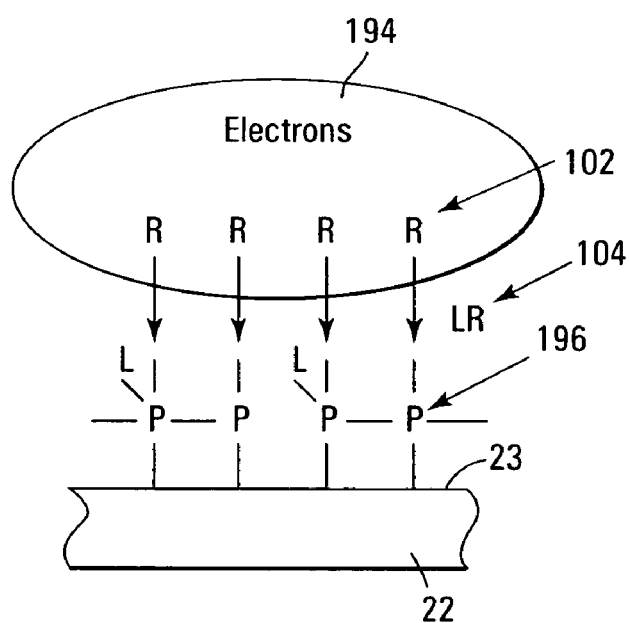
Figure 2D:
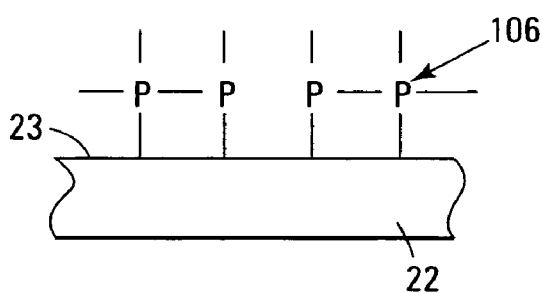
Figure 3:
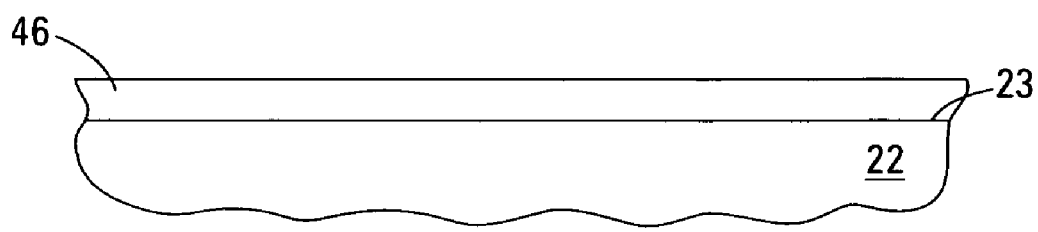
FIG. 3 is a view of a film formed on a substrate assembly at a processing stage subsequent to that of FIGS. 2A–2D.

In operation, for example, in one exemplary embodiment of an ALD process, one or more ALD cycles are used to form a layer 46 on a surface 23 of substrate assembly 22, as shown in FIG. 3. FIGS. 2A–2D schematically illustrate one illustrative embodiment of an ALD cycle according to the present invention.

In the illustrative embodiment shown in FIGS. 2A–2D, the ALD cycle includes four stages such that each precursor or reactant is introduced sequentially into the process chamber 12 so that no gas phase intermixing occurs. First, as shown in FIG. 2A, a first gaseous precursor 192 is introduced into the process chamber 12 via inlet ports 14. The precursor is chemisorbed onto surface 23 of substrate assembly 22. For example, a monolayer of the precursor is chemisorbed onto the surface 23 forming a chemisorbed precursor 196 on surface 23 as shown in FIG. 2B.

In other words, gaseous precursor 192 is introduced into the process chamber 12. Gaseous precursor 192 includes the desired thin film species (P) bonded with the plurality of ligands (L). Species P may be a single element (e.g., Ti, W, Ta, Cu) or a compound (e.g., $TiN_x$, $TaN_x$, or Wx). A molecule of gaseous precursor 192 interacts with a surface bond 194 to form a chemisorbed precursor 196 via a chemical bonding process that may create a plurality of free ligands 198, as shown in FIG. 2A and 2B. As a result of providing the gaseous precursor 192 into the process chamber 12, a monolayer of chemisorbed precursor 196 is formed on the surface 23, as shown in FIG. 2B.

The excess gaseous precursor 192 and free ligands 198, as shown in FIG. 2B, may be purged from the process chamber 12. For example, such excess precursor 192 and free ligands 198 may be pumped out of process chamber 12, possibly with the aid of an inert purging gas, leaving the monolayer of chemisorbed precursor 196 on surface 23. In other words, the chemisorption of the gaseous precursor 192 on surface 23 results in chemisorbed species (P) and a plurality of associated ligands (L).

As shown in FIG. 2C, a reactant (R) 102 is introduced into the process chamber 12. The reactant 102 reacts with chemisorbed precursor 196, as shown in FIG. 2C, in a self-limiting surface reaction to convert the chemisorbed species 196 to about one monolayer or less 106 of the desired species P on surface 23. The self-limiting reaction halts once the chemisorbed precursor 196 fully reacts with reactant 102.

With reactant 102 in process chamber 12, the chemisorbed species 196 is bombarded by electrons 194. The energetic electrons 194 transfer energy to the process, allowing reactant 102 to react with chemisorbed precursor 196 and to strip away unwanted ligands which form a plurality of volatile ligands 104. The reactant 102, in conjunction with the energetic electrons 194, drive the surface reaction such that usually about one atomic layer or less of the desired species P is provided on surface 23 during one ALD cycle. In other words, acting together, reactant 102 reacts with chemisorbed precursor 196, while energetic electrons 194 provide the energy needed to drive the surface reaction to the desired result.

Since the activation energy for the surface reaction is provided by the energetic electrons 194 provided for contact with chemisorbed precursor 196, the reaction does not generally occur without the energy provided by the electron bombardment because the process temperature is kept below the temperature required for thermal activation. Thus, the atomic layer deposition process is electron-induced rather than thermally-induced. The deposition reaction is controlled by modulation of the energy of the energetic electrons 194 and the reactant 102 impinging on the chemisorbed species. Generally, the energy of the energetic electrons 194 is controlled so as to be large enough to drive the surface reaction.

After the self-limiting surface reaction is completed or halted by the fully reacted chemisorbed precursor 196, excess reactant and any reaction byproducts are removed from process chamber via outlet port 16. For example, such excess reactant and any reaction byproducts may be pumped out, again possibly with the aid of an inert purging gas.

As shown in FIG. 2D, the resultant monolayer or less of material 106 of a desired layer remains on surface 23. A desired layer or film thickness is obtained by repeating the ALD cycle as desired. The layer thickness can be controlled to atomic layer (e.g., angstrom scale) accuracy by controlling the number of deposition cycles. As shown in FIG. 3, after performance of a plurality of deposition cycles, layer 46 of the desired material is formed on surface 23.

One skilled in the art will recognize, from the description herein, that various alternate embodiments of ALD processing are possible. However, in each of such alternate processes, during one or more of the atomic layer deposition cycles, a chemisorbed precursor on a surface is subjected to electron bombardment. As such, even though the ALD processes may differ, electron bombardment is used in each of one or more of the ALD cycles according to the present invention.

For example, in one or more embodiments, multiple precursors for compound thin films might be employed. In other embodiments, the deposition cycle may begin with a purging step that may include a plasma used as an in situ clean to remove, for example, carbon-containing residues, native oxides, or other impurities. Further, reactant may provide reactant species for reacting with ligand components to form volatile species. In still other embodiments, reactant may not be required to perform conversion of the chemisorbed precursor to a monolayer or less of material.

Further, the reactant may be another precursor provided to the process chamber for reaction with the first precursor in the ALD cycle. However, the second precursor may not necessarily chemisorb additional material on the surface but rather may react with the first precursor. In other words, the second precursor may cleave some portion of the chemisorbed first precursor, altering the monolayer without forming another monolayer thereon. Additionally, another reactant may be provided for reacting with either one or both of the first and second precursors.

Yet further, for example, in one or more embodiments, provision of a reactant in the process chamber may not be necessary for conversion of the chemisorbed precursor. For example, volatile compounds could be created from ligands of the chemisorbed precursor. In one exemplary embodiment, for example, $Cl_2$ may be created from Cl ligands (e.g., using the electron bombardment). In other words, no reactant would be required if the electron exposure converts ligands to volatile species.

As indicated herein, the variations of the ALD processes that may incorporate the technique of electron bombardment are numerous. Those listed herein are provided for illustration only and not intended to be limiting on the present invention.

Further, ALD is often described as a self-limiting process in that a finite number of sites exist on a substrate assembly surface to which the precursor may form chemical bonds. Once all the finite number of sites on the surface are bonded with a precursor, a precursor will often not bond to other precursor already bonded with the surface. However, process conditions can be varied to promote such bonding and render ALD not self-limiting. Accordingly, ALD may also encompass a species forming other than one monolayer at a time by stacking of the species, forming a layer more than one atom or molecule thick.

Generally, during the ALD process, numerous consecutive deposition cycles are conducted in the process chamber 12, with each cycle depositing a very thin layer of material. Usually, a monolayer or less of material is formed during each deposition cycle such that growth rate on average is from about 0.2 to about 3.0 Å per cycle. The ALD process is usually continued until a layer of desired thickness is built up on the surface of interest.

Further, generally, the introduction of precursor and reactant into the process chamber 12 is provided at a pulse duration sufficient to perform its intended function. For example, the pulse duration of precursor into the process chamber 12 is sufficient to saturate the deposition surface. Further, for example, the pulse duration of reactant into the process chamber 12 is sufficient for converting the chemisorbed species to the desired material. Likewise, the pulse duration of an inert gas into the process chamber for purging is of a time duration necessary to effectively perform such functionality.

ALD is a predominantly chemically-driven process. Accordingly, ALD is often conducted at lower temperatures. During the ALD process, the substrate assembly temperature is maintained at a temperature sufficiently low to maintain intact bonds between the chemisorbed precursor and the underlying surface and to prevent decomposition of the precursor. The temperature is also sufficiently high to avoid condensation of the precursor. In one or more embodiments, typically, substrate temperature is greater than about 150° C., and in further embodiments is greater than 250° C. Further, in one or more embodiments, typically, substrate temperature is less than 650° C., and in further embodiments is less than 400° C. In other words, the precursor is chemisorbed at this temperature.

The surface reaction of converting the chemisorbed species to the desired material of the layer being deposited (e.g., using the reactant) can occur at substantially the same temperature as can adsorption, or at a substantially different temperature. Clearly, variation in temperature, as judged by those of ordinary skill, can occur but still be a substantially same temperature by providing a reaction rate statistically the same as would occur at the temperature of the precursor chemisorption. Chemisorption and subsequent reaction or conversion could instead occur at exactly the same temperature.

Generally, at least in one embodiment of the present invention, pressure in the process chamber 12 during chemisorption of the precursor is typically at a pressure of at least 5 torr. Generally, such higher pressures are required to provide effective chemisorption of the precursor to the surface at relatively low temperatures (e.g., temperatures in the range of 150° C. to about 400° C.).

However, electron bombardment (e.g., operation of an electron gun) would generally need to be performed at a process chamber pressure of about $10^{-6}$ torr or less (i.e., a pressure lower than about $10^{-6}$ torr, such as $10^{-7}$ torr). In some cases, electron exposure may occur at about $10^{-5}$ torr or even possibly at about $10^{-4}$ torr. For example, electron exposure at about $10^{-4}$ torr may be conducted with low concentrations of reactant, e.g., $H_2$ for Cl ligand removal. Such a lower chamber pressure is generally required in order to generate and provide for electron bombardment. As such, preferably, turbo pumping capability is desired wherein a pressure change can be quickly established so as to provide the large relative difference in pressure at and during the different stages of the ALD cycle.

Figure 4:
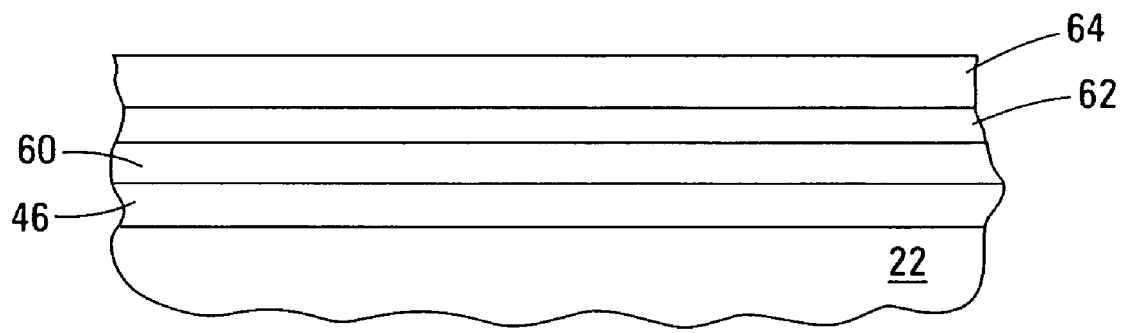
FIG. 4 is yet another diagrammatic view at a processing step subsequent to that of FIG. 3.

Referring to FIG. 4, another layer 60 is shown formed over and physically against layer 46. Layer 60 can be formed with processing analogous to that described with reference to the ALD processes herein and, accordingly, can comprise the same composition as layer 46, or different than layer 46. Further, for example, layer 60 may be deposited using one or more different types of CVD processing. In other words, the ALD processing described herein may be interchanged with other types of processing such as, for example, the formation of a seed layer by an ALD process, and thereafter, further provision of layer 60 on the seed layer, such as by electroplating.

Referring further to FIG. 4, other layers 62, 64 are shown formed over layer 60. Such layers may also be formed utilizing processing analogous to that described with reference to the ALD processes herein and/or may be deposited using one or more different types of deposition processes, such as CVD processing. The layers may be representative of one or more structures created in fabrication of an integrated circuit. For example, layer 46 may be a barrier layer, layer 60 may be an electrode (e.g., formed of conductive material such as Pt, Ir, Rh, Ru, $RuO_2$, $IrO_2$, $RhO_2$, etc.), layer 62 may be a dielectric layer, and layer 64 may be another electrode (e.g., formed of another conductive material that is the same as the layer 60 or different therefrom) for formation of a capacitor structure. Each of the layers may actually be formed of one or more sub-layers.

In other words, for example, ALD processes described herein may be used in the formation of one or more layers of any number of capacitor structures. For example, the capacitor structure may be formed in a container, as a planar capacitor, trench capacitor, etc. Such capacitors may also include one or more barrier layers. The ALD process, according to the present invention, may be utilized to form one or more of the layers of a capacitor structure, as well as such diffusion barrier layers.

Yet further, the ALD process according to the present invention as described herein, may be used in forming one or more layers of any number of different structures. For example, the ALD process may be used to form a layer of a gate for a transistor. In other words, a transistor generally includes a source region, a drain region, and a channel therebetween. A gate electrode is separated from the channel region by a gate insulator. The gate electrode or gate insulator may include material formed by ALD according to the present invention.

One skilled in the art will recognize that the present invention is not limited to any particular application as described herein, but may be utilized to form any layer desired in the fabrication of an integrated circuit.

Figure 5:
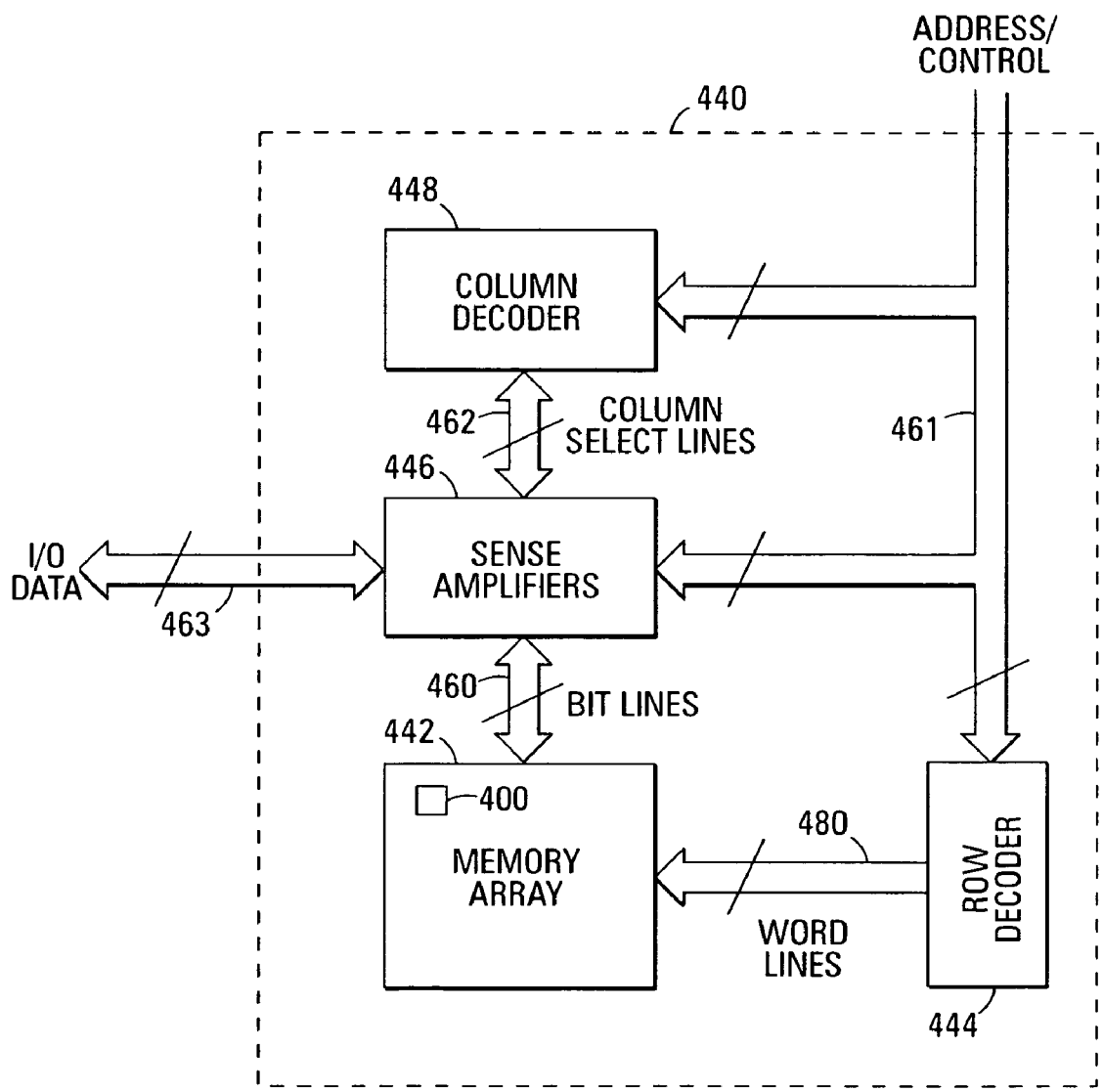
FIG. 5 illustrates an embodiment of a memory device provided utilizing one or more layers formed using ALD according to the present invention.

For example, in FIG. 5, a memory device is illustrated that includes a layer formed according to the teachings of the present invention. The memory device 440 contains a memory array 442, row and column decoders 444, 448 and a sense amplifier circuit 446. The memory array 442 includes a number of transistor cells 400 (e.g., cells having one or more layers thereof formed by atomic layer deposition according to the present invention), whose word lines 480 and bit lines 460 are commonly arranged into rows and columns, respectively. The bit lines 460 of the memory array 442 are connected to the sense amplifier circuit 446, while its word lines 480 are connected to the row decoder 444. Address and control signals are input on address/control lines 461 into the memory device 440 and connected to the column decoder 448, sense amplifier circuit 446, and row decoder 444 and are used to gain read and write access, among other things, to the memory array 442.

The column decoder 448 is connected to the sense amplifier circuit 446 via control and column select signals on column select lines 462. The sense amplifier circuit 446 receives input data destined for the memory array 442 and outputs data read from the memory array 442 over input/output (I/O) data lines 463. Data is read from the cells of the memory array 442 by activating a word line 480 (via the row decoder 444), which couples all of the memory cells corresponding to that word line to respective bit lines 460, which define the columns of the array. One or more bit lines 460 are also activated. When a particular word line 480 and bit lines 460 are activated, the sense amplifier circuit 446 connected to a bit line column detects and amplifies the conduction sensed through a given transistor cell and are transferred to its bit line 460 by measuring the potential difference between the activated bit line 460 and a reference line which may be an inactive bit line. Again, in the read operation, the source region of a given cell is coupled to a grounded sourceline or array plate (not shown). The operation of memory device sense amplifiers is described, for example, in U.S. Pat. Nos. 5,627,785; 5,280,205; and 5,042,011, all assigned to Micron Technology Inc., and incorporated by reference herein.

Figure 6:
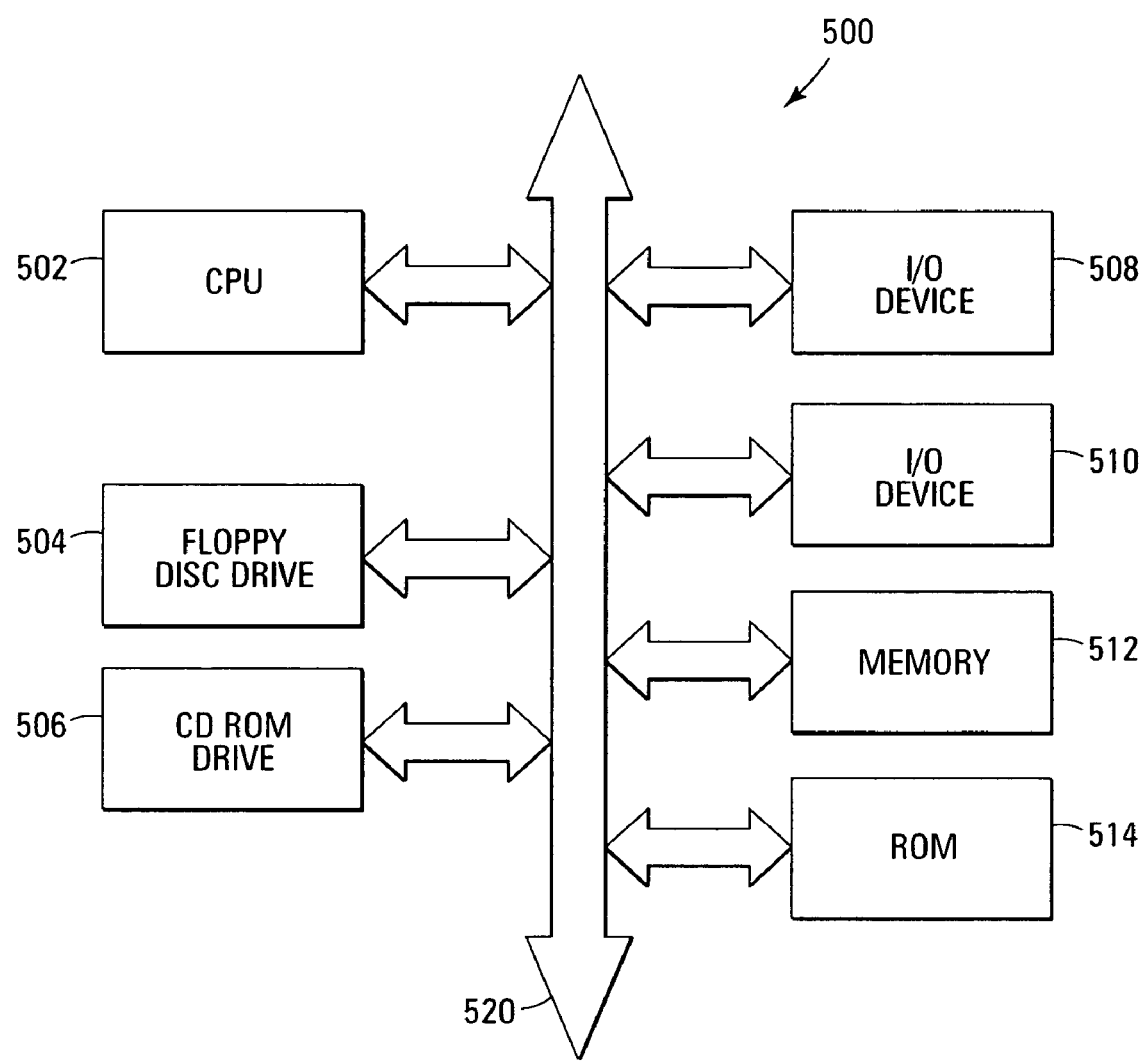
FIG. 6 is a block diagram of an electrical system, or processor-based system, utilizing one or more structures formed using one or more ALD layers provided according to one or more embodiments of the present invention.

FIG. 6 is a block diagram of an electrical system, or processor-based system 500, utilizing transistor cells having one or more layers thereof formed by atomic layer deposition according to the teachings of the present invention. For example, by way of example and not by way of limitation, memory 512 is constructed in accordance with the present invention to have transistor cells having gates formed by atomic layer deposition. However, the invention is not so limited and the same can apply to transistors in the CPU, etc. The processor-based system 500 may be a computer system, a process control system, or any other system employing a processor and associated memory. The system 500 includes a central processing unit (CPU) 502 (e.g., a microprocessor) that communicates with the memory 512 and an I/O device 508 over a bus 520. It must be noted that the bus 520 may be a series of buses and bridges commonly used in a processor-based system, but for convenience purposes only, the bus 520 has been illustrated as a single bus. A second I/O device 510 is illustrated, but is not necessary to practice the invention. The processor-based system 500 can also include read-only memory (ROM) 514 and may include peripheral devices such as a floppy disk drive 504 and a compact disk (CD) ROM drive 506 that also communicates with the CPU 502 over the bus 520 as is well known in the art. It will be appreciated by those skilled in the art that additional circuitry and control signals can be provided, and that the processor-based system 500 has been simplified.

It will be understood that the embodiments shown in FIGS. 5–6 illustrate embodiments for electronic system circuitry in which one or more layers of one or more structures is formed using atomic layer deposition according to the present invention. The illustration of system 500, as shown in FIG. 6, is intended to provide a general understanding of one application for the structure and circuitry of the present invention, and is not intended to serve as a complete description of all the elements and features of an electronic system having one or more layers formed by atomic layer deposition according to the present invention. Further, the invention is equally applicable to any size and type of system 500 and is not intended to be limited to that described above. As one of ordinary skill in the art will understand, such an electronic system can be fabricated in single-package processing units, or even on a single semiconductor chip, in order to reduce the communication time between the processor and the memory device.

Applications containing atomic layer deposited materials, as described herein, include electronic systems for use in memory modules, device drivers, power modules, communication modems, processor modules, and application-specific modules, and may include multilayer, multi-chip modules. Such circuitry can further be a subcomponent of a variety of electronic systems, such as a clock, a television, a cell phone, a personal computer, an automobile, an industrial control system, an aircraft, and others.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method for use in forming a layer, the method comprising:
    providing a substrate assembly in a process chamber, wherein the substrate assembly comprises a surface; and
    performing one or more deposition cycles to form a layer on the surface, wherein each deposition cycle comprises:
        providing a precursor to the process chamber for chemisorption of the precursor on an underlying surface;
        removing any excess precursor from the process chamber;
        contacting the chemisorbed precursor with electrons; and
        providing a reactant in the process chamber for converting the chemisorbed precursor to a monolayer or less of material.

2. The method of claim 1, wherein contacting the chemisorbed precursor with electrons comprises generating an electron beam.

3. The method of claim 2, wherein contacting the chemisorbed precursor with electrons comprises generating a broad electron beam.

4. The method of claim 2, wherein contacting the chemisorbed precursor with electrons comprises:
    generating an electron beam; and
    scanning the electron beam across the chemisorbed precursor.

5. The method of claim 1, wherein contacting the chemisorbed precursor with electrons comprises generating electrons having an energy greater than about 30 eV and less than about 5 keV.

6. The method of claim 1, wherein providing a precursor to the process chamber for chemisorption of the precursor results in a chemisorbed species on the underlying surface associated with a plurality of ligands, and further wherein contacting the chemisorbed precursor with electrons comprises bombarding the chemisorbed precursor to remove one or more of the plurality of ligands.

7. The method of claim 1, wherein the precursor comprises a metal component.

8. The method of claim 1, wherein the method further comprises purging the process chamber after completion of one deposition cycle prior to performing another deposition cycle.

9. The method of claim 1, wherein providing the precursor to the process chamber for chemisorption of the precursor comprises providing the precursor to the process chamber at a pressure of at least 5 Torr, and further wherein contacting the chemisorbed precursor with electrons comprises contacting the chemisorbed precursor with electrons in the process chamber at a pressure of less than $10^{-4}$ Torr.

10. The method of claim 1, wherein contacting the chemisorbed precursor with electrons comprises contacting the chemisorbed precursor with electrons during the provision of the reactant in the process chamber for converting the chemisorbed precursor to a monolayer or less of material.

11. The method of claim 1, wherein contacting the chemisorbed precursor with electrons comprises contacting the chemisorbed precursor with electrons before the provision of the reactant in the process chamber for converting the chemisorbed precursor to a monolayer or less of material.

12. A method for use in forming a layer by atomic layer deposition, the method comprising:
    providing a substrate assembly in a process chamber, wherein the substrate assembly comprises a surface; and
    performing a plurality of atomic layer deposition cycles to form a layer on the surface, wherein each atomic layer deposition cycle comprises at least exposing a chemisorbed precursor to electron bombardment.

13. The method of claim 12, wherein at least one of the plurality of atomic layer deposition cycles further comprises:
    providing a precursor to the process chamber for chemisorption of the precursor on an underlying surface; and
    providing a reactant in the process chamber for converting the chemisorbed precursor to material for forming the layer.

14. The method of claim 13, wherein the at least one atomic layer deposition cycle further comprises:

purging the process chamber after chemisorption of the precursor; and purging the process chamber after converting the chemisorbed precursor to the material for forming the layer.

15. The method of claim 12, wherein at least one of the plurality of atomic layer deposition cycles further comprises providing a precursor to the process chamber for chemisorption of the precursor on an underlying surface, wherein the precursor chemisorbed on the underlying surface comprises a chemisorbed species associated with a plurality of ligands, and further wherein exposure of the chemisorbed precursor to electron bombardment results in conversion of the chemisorbed precursor to material for forming the layer and one or more of the plurality of ligands to volatile species.

16. The method of claim 15, wherein the at least one atomic layer deposition cycle further comprises:

purging the process chamber after chemisorption of the precursor; and purging the process chamber after converting the chemisorbed precursor to the material for forming the layer.

17. The method of claim 12, wherein at least one of the atomic layer deposition cycles comprises providing a precursor to the process chamber for chemisorption of the precursor on an underlying surface, wherein providing the precursor to the process chamber comprises providing the precursor to the process chamber at a pressure of at least 5 Torr, and further wherein at least exposing the chemisorbed precursor to electron bombardment comprises exposing the chemisorbed precursor to electron bombardment in the process chamber at a pressure of less than $10^{-4}$ Torr.

18. The method of claim 12, wherein at least exposing the chemisorbed precursor to electron bombardment comprises:

generating an electron beam; and directing the electron beam toward the chemisorbed precursor.

19. The method of claim 18, wherein generating an electron beam comprises generating a broad electron beam.

20. The method of claim 18, wherein directing the electron beam toward the chemisorbed precursor comprises scanning the electron beam across the chemisorbed precursor.

21. The method of claim 12, wherein exposing the chemisorbed precursor to electron bombardment comprises exposing the chemisorbed precursor to electrons having an energy greater than about 30 eV and less than about 5 keV.

22. The method of claim 12, wherein the chemisorbed precursor comprises a chemisorbed species associated with a plurality of ligands, and further wherein exposing the chemisorbed precursor to electron bombardment comprises bombarding the chemisorbed precursor to remove one or more of the plurality of ligands.

23. The method of claim 12, wherein the chemisorbed precursor comprises a metal component.

24. The method of claim 12, wherein the at least one atomic layer deposition cycle is performed at a substrate temperature greater than about 250° C. and less than about 650° C.

25. A method for use in forming a layer, the method comprising:

providing a substrate assembly in a process chamber, wherein the substrate assembly comprises a surface; and performing one or more deposition cycles to form a layer on the surface, wherein each deposition cycle comprises:

providing a precursor to the process chamber for chemisorption of the precursor on an underlying surface, wherein the precursor chemisorbed on the underlying surface comprises a chemisorbed species associated with a plurality of ligands;

removing any excess precursor from the process chamber;

contacting the chemisorbed precursor with electrons to convert the chemisorbed precursor to material for forming the layer and to convert one or more of the plurality of ligands to volatile species; and purging the process chamber after completion of one deposition cycle prior to performing another deposition cycle.

26. The method of claim 25, wherein contacting the chemisorbed precursor with electrons comprises generating an electron beam.

27. The method of claim 26, wherein contacting the chemisorbed precursor with electrons comprises generating a broad electron beam.

28. The method of claim 26, wherein contacting the chemisorbed precursor with electrons comprises:

generating an electron beam; and scanning the electron beam across the chemisorbed precursor.

29. The method of claim 25, wherein contacting the chemisorbed precursor with electrons comprises generating electrons having an energy greater than about 30 eV and less than about 5 keV.

30. The method of claim 25, wherein the precursor comprises a metal component.

31. A method for use in forming a layer comprising at least one metal, the method comprising:

providing a substrate assembly in a process chamber, wherein the substrate assembly comprises a surface; and performing one or more deposition cycles to form a layer on the surface, wherein each of the one or more deposition cycles comprises:

providing at least one precursor in the process chamber for chemisorption on a deposition surface, wherein the at least one precursor comprises a metal component; and contacting the chemisorbed precursor with electrons for use in forming the layer on the surface of the substrate assembly.

32. The method of claim 31, wherein at least one of the deposition cycles further comprises providing a reactant in the process chamber for converting the chemisorbed precursor to a monolayer or less of material comprising the metal component.

33. The method of claim 32, wherein the at least one deposition cycle further comprises:

purging the process chamber after chemisorption of the precursor; and purging the process chamber after converting the chemisorbed precursor to the material for forming the layer.

34. The method of claim 31, wherein the precursor chemisorbed on the deposition surface comprises a chemisorbed species associated with a plurality of ligands, and further wherein contacting the chemisorbed precursor with electrons results in conversion of the chemisorbed precursor to material for forming the layer and one or more of the plurality of ligands to volatile species.

35. The method of claim 34, wherein at least one of the deposition cycles further comprises:

purging the process chamber after chemisorption of the precursor; and purging the process chamber after converting the chemisorbed precursor to the material for forming the layer.

36. The method of claim 31, wherein contacting the chemisorbed precursor with electrons comprises generating an electron beam.

37. The method of claim 36, wherein contacting the chemisorbed precursor with electrons comprises generating a broad electron beam.

38. The method of claim 36, wherein contacting the chemisorbed precursor with electrons comprises:

generating an electron beam; and scanning the electron beam across the chemisorbed precursor.

39. The method of claim 31, wherein contacting the chemisorbed precursor with electrons comprises generating electrons having an energy greater than about 30 eV and less than about 5 keV.

40. The method of claim 31, wherein providing at least one precursor to the process chamber for chemisorption results in a chemisorbed species on the deposition surface associated with a plurality of ligands, wherein the chemisorbed species comprises the metal component, and further wherein contacting the chemisorbed precursor with electrons comprises bombarding the chemisorbed precursor to remove one or more of the plurality of ligands.

41. The method of claim 31, wherein the precursor comprises an organometallic precursor.

42. A method for use in fabrication of an integrated circuit structure, the method comprising:

providing a substrate assembly in a process chamber, wherein the substrate assembly comprises a surface; and performing one or more deposition cycles to form a layer on the surface, wherein each of the one or more deposition cycles comprises:

providing at least one precursor in the process chamber for chemisorption of the precursor on a deposition surface resulting in a chemisorbed species associated with a plurality of ligands; and directing electrons toward the precursor chemisorbed on the deposition surface to modify the chemisorbed precursor.

43. The method of claim 42, wherein at least one of the deposition cycles further comprises:

purging the process chamber after chemisorption of the precursor;

converting the chemisorbed precursor to material for forming the layer; and purging the process chamber after converting the chemisorbed precursor to the material for forming the layer before performing another deposition cycle.

44. The method of claim 42, wherein directing electrons toward the precursor chemisorbed on the deposition surface to modify the chemisorbed precursor comprises removing one or more of the plurality of ligands associated with the chemisorbed species.

45. The method of claim 42, wherein directing electrons toward the precursor chemisorbed on the deposition surface comprises generating an electron beam.

46. The method of claim 45, wherein directing electrons toward the precursor chemisorbed on the deposition surface comprises generating a broad electron beam.

47. The method of claim 45, wherein directing electrons toward the precursor chemisorbed on the deposition surface comprises:

generating an electron beam; and scanning the electron beam across the chemisorbed precursor on the deposition surface.

48. The method of claim 42, wherein directing electrons toward the precursor chemisorbed on the deposition surface comprises generating electrons having an energy greater than about 30 eV and less than about 5 keV.

49. The method of claim 42, wherein providing the precursor to the process chamber for chemisorption of the precursor on the surface comprises providing the precursor to the process chamber at a pressure of at least 5 Torr, and further wherein directing electrons toward the precursor chemisorbed on the deposition surface comprises contacting the chemisorbed precursor with electrons in the process chamber at a pressure of less than $10^{-4}$ Torr.

50. The method of claim 42, wherein the layer forms part of a capacitor structure or a gate electrode structure.

51. The method of claim 42, wherein the layer forms part of a memory device.

52. A system for use in forming a layer, the system comprising:

a process chamber comprising a holder adapted to position a substrate assembly therein;

at least one precursor source for providing a precursor to the process chamber during one or more atomic layer deposition cycles for chemisorption on a deposition surface; and an electron source operable to provide electrons for contact with a chemisorbed precursor on the substrate assembly when positioned by the holder.

53. The system of claim 52, wherein the system further comprises at least one reactant source for providing a reactant to the process chamber subsequent to purging the process chamber of any excess of the precursor.

54. The system of claim 52, wherein a pressure in the process chamber is adjustable to at least 5 Torr for chemisorption of precursor on the deposition surface, and further is adjustable to a pressure of less than $10^{-4}$ Torr during exposure of the chemisorbed precursor to electrons from the electron source.

55. The system of claim 52, wherein the electron source is operable to generate an electron beam and direct the electron beam toward the chemisorbed precursor when the substrate assembly is positioned by the holder.

56. The system of claim 54, wherein the electron source is operable to generate a broad electron beam.

57. The system of claim 54, wherein the electron source is operable to scan the electron beam across the chemisorbed precursor when the substrate assembly is positioned by the holder.

58. The system of claim 52, wherein electron source is operable to generate electrons having an energy greater than about 30 eV and less than about 5 keV.

59. The system of claim 52, wherein the precursor source provides a precursor comprising a metal component.

60. The system of claim 52, wherein the precursor provided in the process chamber chemisorbs on the deposition surface resulting in a chemisorbed species associated with a plurality of ligands, and further wherein the electron source is operable to provide electrons having an energy sufficient for modifying the chemisorbed precursor.

61. A system for use in forming a layer by atomic layer deposition, the system comprising:

a process chamber configured to perform atomic layer deposition; and an electron source operable to provide electrons for contact with chemisorbed precursor on a substrate assembly when positioned within the process chamber.

62. The system of claim 61, wherein the process chamber is configured to receive one or more precursors therein.

63. The system of claim 61, wherein the process chamber is further configured to be purged using at least one inert gas.

64. The system of claim 61, wherein the process chamber is adjustable to a pressure of at least 5 Torr for chemisorption of precursor, and further is adjustable to a pressure of less than $10^{-4}$ A Torr for generation of electrons to contact the chemisorbed precursor.

65. The system of claim 61, wherein the electron source is operable to generate an electron beam and direct the electron beam toward the chemisorbed precursor when the substrate assembly is positioned in the process chamber.

66. The system of claim 65, wherein the electron source is operable to generate a broad electron beam.

67. The system of claim 61, wherein the electron source is operable to generate an electron beam and scan the electron beam across the chemisorbed precursor when the substrate assembly is positioned in the process chamber.

68. The system of claim 61, wherein the electron source is operable to generate electrons having an energy greater than about 30 eV and less than about 5 keV.

69. The system of claim 61, wherein the chemisorbed precursor comprises a chemisorbed species associated with a plurality of ligands, and further wherein the electron source is operable to provide electrons having an energy sufficient for removing one or more of the plurality of ligands.

* * * * *